United States Patent [19]
McClintock

[11] Patent Number: 5,144,167
[45] Date of Patent: Sep. 1, 1992

[54] ZERO POWER, HIGH IMPEDANCE TTL-TO-CMOS CONVERTER

[75] Inventor: Cameron McClintock, Mountain View, Calif.

[73] Assignee: Altera Corporation, San Jose, Calif.

[21] Appl. No.: 701,686

[22] Filed: May 10, 1991

[51] Int. Cl.⁵ .................. H03K 19/0175; H03K 19/20
[52] U.S. Cl. .................................... 307/475; 307/448; 307/450; 307/451
[58] Field of Search ............... 307/475, 456, 448, 450, 307/443, 451

[56] References Cited

U.S. PATENT DOCUMENTS

| | | | |
|---|---|---|---|
| 4,612,461 | 9/1986 | Sood | 307/475 |
| 4,642,488 | 2/1987 | Parker | 307/475 |
| 5,036,226 | 7/1991 | Tonnu et al. | 307/475 |

Primary Examiner—Edward P. Westin
Assistant Examiner—Andrew Sanders
Attorney, Agent, or Firm—Robert R. Jackson

[57] ABSTRACT

A TTL-to-CMOS buffer converts TTL logical signals to CMOS logical signals. The circuit draws little or no power for either valid TTL signal level. The circuit also has high input impedance so that there is little or no input current.

4 Claims, 1 Drawing Sheet

ZERO POWER, HIGH IMPEDANCE TTL-TO-CMOS CONVERTER

BACKGROUND OF THE INVENTION

This invention relates to circuitry for converting logical signals from the levels typically used for transistor-transistor logic ("TTL") to the levels typically used for complementary metal oxide semiconductor ("CMOS") logic.

It is highly desirable for circuits of the type described above to draw little or no power for any valid TTL input signal level. Such circuits should also have high input impedance so that little or no current flows between the circuit and the TTL input signal source at any input signal level.

In view of the foregoing, it is an object of this invention to provide TTL-to-CMOS converters or buffers which draw little or no power for any valid TTL input signal level.

It is another object of this invention to provide TTL-to-CMOS converters or buffers which have very high input impedance at all input signal levels.

SUMMARY OF THE INVENTION

These and other objects of the invention are accomplished in accordance with the principles of the invention by providing TTL-to-CMOS buffers in which the TTL input signal is applied to the gates of a pair of complementary transistor switches. The source-drain channels of these switches are connected in series with the source-drain channel of a third transistor switch between a source of CMOS logical one potential and a source of CMOS logical zero potential. A reference potential is applied to the gate of the third transistor switch. A high input impedance inverting output stage is connected to the node between the first and second transistor switches. The reference potential is selected so that it holds off both the third transistor switch and the one of the first and second transistor switches which is connected directly to the third transistor switch for any valid TTL logical one input level. Under these conditions only the other of the first and second transistor switches is on, thereby controlling the level of the signal applied to the output stage and therefore the output signal of the output stage. For any valid TTL logical zero input level, the formerly on one of the first and second transistor switches turns off, and the reference potential allows the other of the first and second switches and the third switch to turn on. This causes the output stage to switch.

The circuits of this invention have high input impedance because the TTL input is connected only to the gates of the first and second transistor switches. These circuits consume little or no power in either valid TTL state because at least one of the series-connected first, second, and third transistor switches is off in each of these states and the output stage also has high impedance in each of these states.

Further features of this invention, its nature and various advantages will be more apparent from the accompanying drawings and the following detailed description of the preferred embodiments.

DETAILED DESCRIPTION OF THE PREFERRED EMBODIMENTS

Figure 1:
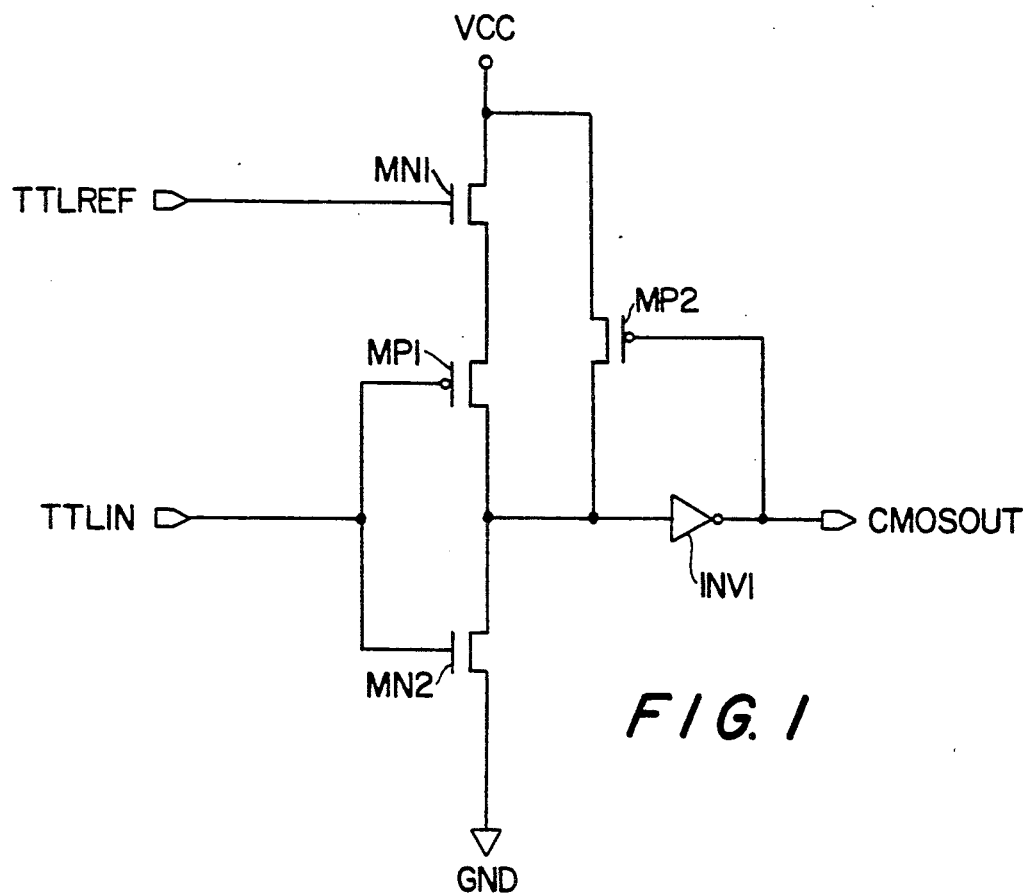
FIG. 1 is a schematic diagram of a first illustrative embodiment of the invention.

As shown in FIG. 1, an illustrative embodiment of the TTL-to-CMOS buffers of this invention includes a source VCC of CMOS logical one potential (e.g., approximately 5 volts) and a source GND of CMOS logical zero potential (e.g., 0 volts). The source-drain channels of three field-effect transistor ("FET") switches MN1, MP1, and MN2 are connected in series between these potential sources. The gate terminals of MP1 and MN2 are connected to the TTL input signal source TTLIN. A reference potential source TTLREF is connected to the gate of MN1. The input terminal of a high input impedance inverting output stage is connected to the node between the source-drain channels of MP1 and MN2. This output stage includes conventional high input impedance inverter INV1 and FET MP2. The gate of MP2 is connected to the output terminal of INV1. The source-drain channel of MP2 is connected between VCC and the input terminal of INV1.

MN1 and MN2 are N-channel CMOS transistor devices. MP1 and MP2 are P-channel CMOS transistor devices.

In accordance with conventional signal level standards, the lowest acceptable value for TTLIN to indicate logical one is 2 volts, and the highest acceptable value for TTLIN to indicate logical zero is 0.8 volts. MN2 is therefore on whenever TTLIN is logical one, and MN2 is off whenever TTLIN is logical zero.

TTLREF is chosen so that MN1 and MP1 are both off whenever TTLIN is logical one. In particular, TTLREF is chosen to be slightly less than 2 volts (the lowest value of TTLIN which can indicate logical one) plus the sum of the threshold voltages of MN1 and MP1 (typically 0.8 to 1.0 volt each). Accordingly, TTLREF is typically slightly less than 3.6 to 4.0 volts, depending on the precise MN1 and MP1 threshold voltage values. This voltage is just low enough to hold off MN1 and MP1 even when TTLIN is at its lowest valid logical one level (i.e., 2 volts). The potential difference between the gate of MN1 and the node between MN1 and MP1 cannot go low enough to turn on MN1 without turning off MP1 by lowering the potential difference between that node and the gate of MP1 below the threshold voltage of MP1. Accordingly, MN1 and MP1 both remain off while TTLIN is logical one. Because MN2 is on under this condition, the node to which the input terminal of INV1 is connected is pulled low, thereby causing the output of INV1 to go high. This provides a CMOSOUT signal of logical one and also turns off MP2.

When TTLIN goes to logical zero (i.e., 0.8 volts or less), MN2 turns off and MN1 and MP1 both come on. This raises the potential of the node connected to the input terminal of INV1 to TTLREF minus the threshold voltage of MN1. This is sufficient to cause INV1 to begin to switch from a high CMOSOUT level to a low CMOSOUT level. This, in turn, causes MP2 to turn on, which pulls the INV1 input node up to VCC.

The buffer of FIG. 1 draws no power for either valid TTLIN level because in the circuit between VCC and GND either MN2 or the other transistors are off while TTLIN is either logical one or logical zero. The buffer has high input impedance (i.e., the current flow through TTLIN is zero or very small) because TTLIN is connected only to the gates of FETs MP1 and MN2.

Figure 2:
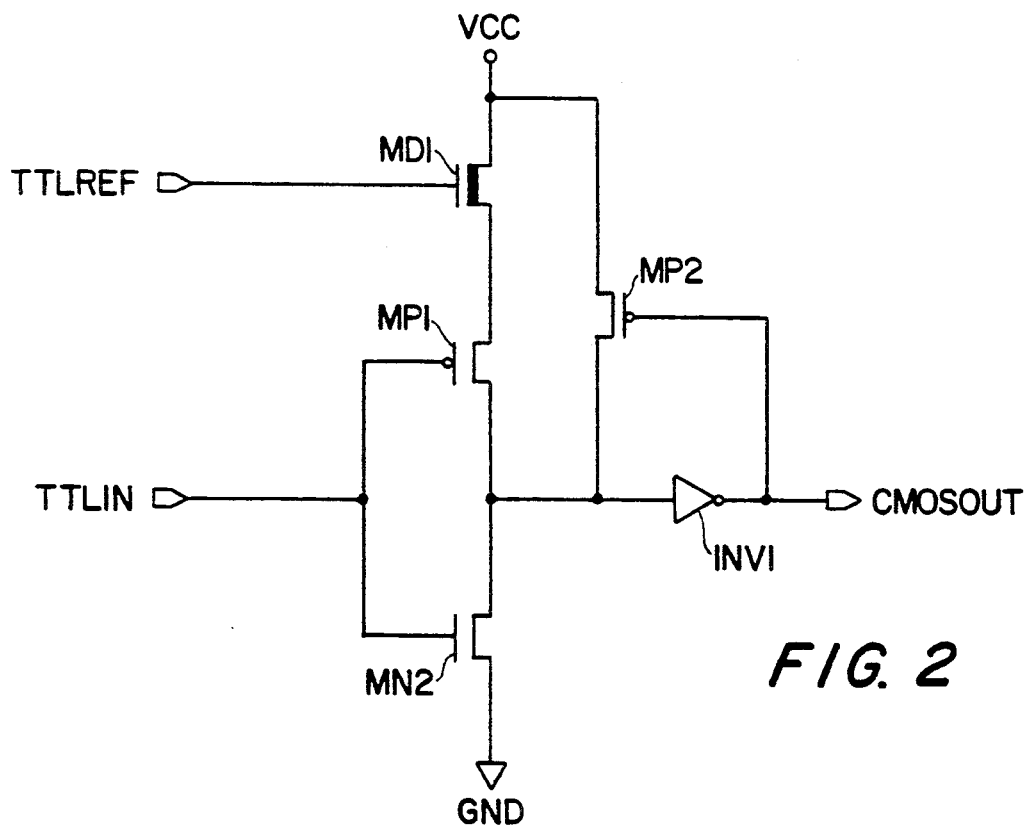
FIG. 2 is a schematic diagram of a second illustrative embodiment of the invention.

FIG. 2 shows an alternative embodiment in which MN1 is replaced by depletion device MD1. This is an FET which is on unless a sufficient negative voltage difference (e.g., −0.8 to −1.0 volts) exists between its gate and its source. TTLREF is again chosen to be slightly less than the sum of the lowest valid TTLIN logical one potential (typically 2 volts as mentioned above) and the threshold voltages of MD1 and MP1. Because the threshold voltage of MD1 is negative, TTLREF is typically slightly less than 2 volts. This value of TTLREF may be easier to generate from VCC than the TTLREF value used in FIG. 1. In all other respects the buffer of FIG. 2 is constructed and operates similarly to the buffer of FIG. 1.

A variable amount of hysteresis can be added to the input by adjusting the ratio of the sizes of MP1 and MP2. With MP2 relatively small there is a minimum amount of hysteresis and the circuit delay is minimum. With MP1 relatively small there is a large amount of hysteresis and the delay increases.

It will be understood that the foregoing is merely illustrative of the principles of the invention and that various modifications can be made by those skilled in the art without departing from the scope and spirit of the invention. For example, the sizes of the transistors can be varied to alter the speed and hysteresis characteristics of the circuit as mentioned above. An another example, transistor types can be varied and signal polarities and relative potentials can be altered.

The invention claimed is:

1. A buffer circuit for converting a TTL input signal to a CMOS output signal, said buffer circuit drawing little or no current and presenting a high input impedance for any input signal level, said buffer circuit comprising:
    a source of CMOS logical one potential;
    a source of CMOS logical zero potential;
    a TTL input signal source;
    a source of a predetermined reference potential;
    first and second complementary transistor switch means having their gates connected to said TTL input signal source and their source-drain channels connected in series to said source of CMOS logical zero potential;
    third depletion device transistor switch means having its gate connected to said source of a predetermined reference potential and its source-drain channel connected in series between said source to CMOS logical one potential and, via the series connection of the source-drain channels of said first and second complementary switch means, said source of CMOS logical zero potential; and
    high input impedance inverter means for logically inverting the signal at a node in the series connection of the source-drain channels of said first and second complementary switch means between said first and second switch means, said predetermined reference potential being selected so that said third depletion device transistor switch means and the one of said first and second transistor switch means which is connected to said third depletion device transistor switch means are held off by any valid TTL logical one input signal, and so that any valid TTL logical zero input signal turns on said third depletion device transistor switch means and said one of said first and second transistor switch means.

2. The circuit defined in claim 1 wherein said predetermined reference potential is slightly less than the lowest valid TTL logical one input signal potential plus the threshold voltage of said third transistor switch means and the threshold voltage of said one of said first and second transistor switch means.

3. The circuit defined in claim 1 wherein said high input impedance inverter means comprises:
    a high input impedance inverter subcircuit having an input terminal connected to said node and an output terminal to which said inverter subcircuit applies a signal which is the logical inverse of the signal applied to said input terminal; and
    fourth transistor switch means having its gate connected to said output terminal and its source-drain channel connected in series between said source of CMOS logical one potential and said input terminal so that said fourth transistor switch means is on only when said inverter subcircuit output signal is logical zero.

4. The circuit defined in claim 3 wherein said fourth transistor switch means is a P-channel device.

* * * * *